US006714049B2

(12) United States Patent
Shenai et al.

(10) Patent No.: US 6,714,049 B2
(45) Date of Patent: Mar. 30, 2004

(54) LOGIC STATE TRANSITION SENSOR CIRCUIT

(75) Inventors: Krishna Shenai, Naperville, IL (US); Erik A. McShane, Lockport, IL (US)

(73) Assignee: Shakti Systems, Inc., Lisle, IL (US)

( * ) Notice: Subject to any disclaimer, the term of this patent is extended or adjusted under 35 U.S.C. 154(b) by 36 days.

(21) Appl. No.: 10/217,895

(22) Filed: Aug. 12, 2002

(65) Prior Publication Data

US 2003/0034818 A1 Feb. 20, 2003

Related U.S. Application Data

(60) Provisional application No. 60/311,568, filed on Aug. 10, 2001.

(51) Int. Cl.[7] .......................................... H03K 19/0175
(52) U.S. Cl. ............................. 326/82; 326/88; 324/111
(58) Field of Search ............................ 326/82, 11, 36, 326/88; 324/111

(56) References Cited

U.S. PATENT DOCUMENTS

| 2,483,727 | A | | 11/1949 | Frisbie | |
| 4,713,742 | A | | 12/1987 | Parsley | 363/124 |
| 5,005,295 | A | | 4/1991 | Fushiya | |
| 5,057,712 | A | * | 10/1991 | Trinh et al. | 326/86 |
| 5,248,907 | A | * | 9/1993 | Lin et al. | 326/33 |
| 5,338,980 | A | * | 8/1994 | Ovens | 326/18 |
| 5,442,534 | A | | 8/1995 | Cuk et al. | 363/16 |
| 5,477,132 | A | | 12/1995 | Canter et al. | 323/282 |
| 5,552,695 | A | | 9/1996 | Schwartz | 323/271 |
| 5,577,600 | A | | 11/1996 | Schoene | |
| 5,583,424 | A | | 12/1996 | Sato et al. | 323/282 |
| 5,594,324 | A | | 1/1997 | Canter et al. | 323/282 |
| 5,619,165 | A | * | 4/1997 | Fournel et al. | 327/546 |
| 5,638,945 | A | | 6/1997 | Fukinuki | |
| 5,649,176 | A | | 7/1997 | Selvidge et al. | 395/551 |
| 5,694,030 | A | | 12/1997 | Sato et al. | 323/282 |
| 5,714,863 | A | | 2/1998 | Hwang et al. | 320/1 |
| 5,754,436 | A | | 5/1998 | Walsh et al. | 364/483 |
| 5,799,198 | A | | 8/1998 | Fung | 395/750.05 |
| 5,805,459 | A | | 9/1998 | Kapoor | 364/489 |
| 5,815,380 | A | | 9/1998 | Cuk et al. | 363/16 |
| 5,874,826 | A | | 2/1999 | Chen et al. | 323/222 |
| 5,883,797 | A | | 3/1999 | Amaro et al. | 363/65 |
| 5,912,552 | A | | 6/1999 | Tateishi | 323/285 |
| 5,969,312 | A | | 10/1999 | Svetlik | |
| 6,009,531 | A | | 12/1999 | Selvidge et al. | 713/400 |
| 6,025,705 | A | | 2/2000 | Nguyen et al. | 323/282 |
| 6,057,518 | A | | 5/2000 | Bascom | |
| 6,225,794 | B1 | | 5/2001 | Criscione et al. | 323/283 |
| 6,232,752 | B1 | | 5/2001 | Bissell | 323/225 |
| 6,246,222 | B1 | | 6/2001 | Nilles et al. | 323/283 |
| 6,288,350 | B1 | | 9/2001 | Campbell | |
| 6,340,802 | B1 | | 1/2002 | Bascom | |

OTHER PUBLICATIONS

C.–H. Ding et al, "Improving the Efficiency of Monte Carlo Power Estimation," *IEEE Trans. VLSI Syst.*, vol. 8, No. 5, pp. 584–593, 2000.

(List continued on next page.)

*Primary Examiner*—Don Le
(74) *Attorney, Agent, or Firm*—McDonnell Boehnen Hulbert & Berghoff

(57) ABSTRACT

A logic state transition sensor circuit. The logic state transition sensor circuit detects and records transitions in voltage corresponding to a transition of a digital logic state (high to low; low to high). The logic state transition sensor circuit may include a sensing circuit containing sensing and amplification elements and a recording circuit containing recording elements. When a logic state transition occurs at an input of the sensing circuit, a positive logic pulse may be generated. Propagation of the logic pulse to the recording circuit causes a charge to be transferred to an output stage capacitor. Repeated logic state transitions cause similar incremental increases in the charge of the output stage capacitor. Charge transfer is governed by ratios of capacitors internal to the recording circuit and hence may be insensitive to process variation. The output stage capacitor may output a voltage representative of a number of logic state transitions sensed.

25 Claims, 12 Drawing Sheets

OTHER PUBLICATIONS

C.-S. Ding et al, "Stratified Random Sampling for Power Estimation," *IEEE Trans. Computer–Aided Design of Integrated Circuits and Systems,* vol. 17, No. 6, pp. 465–471, 1998.

C.-T. Hsieh and M. Pedram, "Microprocessor Power Estimation Using Profile–Driven Program Synthesis," *IEEE Trans. Computer–Aided Design of Integrated Circuits and Systems,* vol. 17, No. 11, pp. 1080–1089, 1998.

C.-Y. Tsui et al, "Efficient Estimation of Dynamic Power Consumption under a Real Delay Model," *IEEE Int. Conf. Computer–Aided Design (ICCAD) Dig.,* 1993, pp. 224–228.

D. Marculescu et al, "Information Theoretic Measures for Power Analysis," *IEEE Trans. Computer–Aided Design of Integrated Circuits and Systems,* vol. 15, No. 6, pp. 599–610, 1996.

E. Macii et al, "High–level Power Modeling, Estimation, and Optimization," *IEEE Trans. Computer–Aided Design of Integrated Circuits and Systems,* vol. 17, No. 11, 1061–1079, 1998.

M. Fujita and R. Murgai, "Delay Estimation and Optimization of Logic Circuits: A Survey," *Proc. IEEE Design Automation Conf. (DAC),* 1997, pp. 25–30.

R. Marculescu et al, "Probabilistic Modeling of Dependencies During Switching Activity Analysis," *IEEE Trans. Computer–Aided Design of Integrated Circuits and Systems,* vol. 17, No. 2, pp. 73–83, 1998.

R. Murgai et al, "Decomposition of Logic Functions for Minimum Transition Activity," *Proc. IEEE European Design and Test Conf. (ED&TC),* 1995, pp. 404–410.

Z. Chen et al, "Efficient Statistical Approach to Estimate Power Considering Uncertain Properties of Primary Inputs," *IEEE Trans. VLSI Syst.,* vol. 6, No. 3, pp. 484–492, 1998.

* cited by examiner

US 6,714,049 B2

LOGIC STATE TRANSITION SENSOR CIRCUIT

PRIORITY

The present patent application claims priority under 35 U.S.C. §119(e) to U.S. Provisional Patent Application Serial No. 60/311,568; filed on Aug. 10, 2001, the full disclosure of which is incorporated herein by reference.

FIELD OF INVENTION

The present invention relates to measurement and analysis of electronic logic circuits and, more particularly, to a logic state transition sensor circuit.

BACKGROUND

A fundamental means of reducing power dissipation within a digital logic system, such as within a microprocessing system, is to reduce an amount of logic state transitions that occur during execution of arbitrary operations. A logic state transition is typically an operation, which occurs when an electrical signal with a voltage that represents a logic value changes to a different voltage that represents a different logic value.

In ideal circumstances, the definitive nature of Boolean operations permits an exact determination of the amount of logic state transitions that can occur at a particular electrical node of a circuit in response to known logic inputs to the circuit. The situation is complicated though, by injection of random uncontrollable operations and/or logic inputs, which occurs during normal processing within the circuit. This prevents the possibility of a known specification of outputs or logic state transition activity within the circuit. The situation is further complicated by an extremely large number of electrical nodes (or logic gates) within typical circuits, as within state-of-the-art integrated circuits, which makes a thorough analysis of actual logic state transitions that occur at each constituent gate or electrical node of an integrated circuit very impractical.

Simulations using statistical methods can also produce estimations of logic transition activity at a particular electrical node of a circuit. However, simulations also may not be able to determine actual logic transition activity resulting from random operations and inputs that occur during normal operation, since simulations cannot precisely predict when a random input will occur.

Also, to reduce the complexity of simulations, algorithms, or statistical methods, logic signals are commonly modeled as either delay-free signals or with nominal delay timing. The timing may be calculated and estimated based on a nominal implementation of the logic circuit as that compared to an integrated circuit. However, actual logic signals are subject to timing uncertainty due to uncontrollable circumstances such as random variations in the integrated circuit processing, disturbances in supply voltage, temperature changes, as well as many others. The cumulative effect of these variations can lead to momentary incorrect logic state transitions known as glitches. Since pure simulation or statistical methods cannot account for these random variations, simulation and statistical analysis procedures cannot accurately model or predict when a glitch will occur within a circuit.

Consequently, simulations and statistical methods for estimating logic state transition activity within a circuit are limited by unrealistic assumptions of delay-free or fixed-delay logic signals, a lack of ability to model random variations in logic signal timing, and an inability to perform a thorough analysis of complex circuitry under arbitrary combinations of operations and logic inputs to the circuit. Even if logic state transition activity can be accurately predicted (or closely predicted) by a simulation, it may be impractical to use simulation data when a measurement of the activity may be desired in real-time. Therefore, it is desirable to overcome these problems.

SUMMARY

Generally speaking, the present invention may permit a direct, real-time measurement of logic state transition activity at an electrical node. As such, measurements of logic state transitions may not be limited by assumptions made from using simulation or statistical methods.

In an exemplary embodiment, a logic state transition sensor circuit is provided. The logic state transition sensor circuit may comprise a sensing circuit coupled to an electrical node and a recording circuit coupled to the sensing circuit. The sensing circuit may generate a pulse in response to a logic state transition at the electrical node. In turn, the recording circuit may accumulate a capacitive charge in response to each pulse generated by the sensing circuit. The accumulated capacitive charge may be representative of a number of logic state transitions sensed at the electrical node.

In another respect, the sensing circuit may generate a momentary output signal in response to a logic state transition at the electrical node. The recording circuit may be able to keep count of each momentary output signal generated by the sensing circuit. The recording circuit may output an output signal representative of a number of logic state transitions sensed at the electrical node.

In still another respect, the exemplary embodiment may take the form of a method of sensing logic state transitions. The method may include generating a momentary signal in response to a logic state transition at an electrical node. The method may also include accumulating a capacitive charge in response to each momentary signal generated. The method may further include outputting an output signal representative of a number of logic state transitions sensed at the electrical node.

These as well as other features and advantages will become apparent to those of ordinary skill in the art by reading the following detailed description, with appropriate reference to the accompanying drawings.

BRIEF DESCRIPTION OF FIGURES

Reference is made to the attached figures, wherein.

DETAILED DESCRIPTION OF EXEMPLARY EMBODIMENTS

Figure 1:
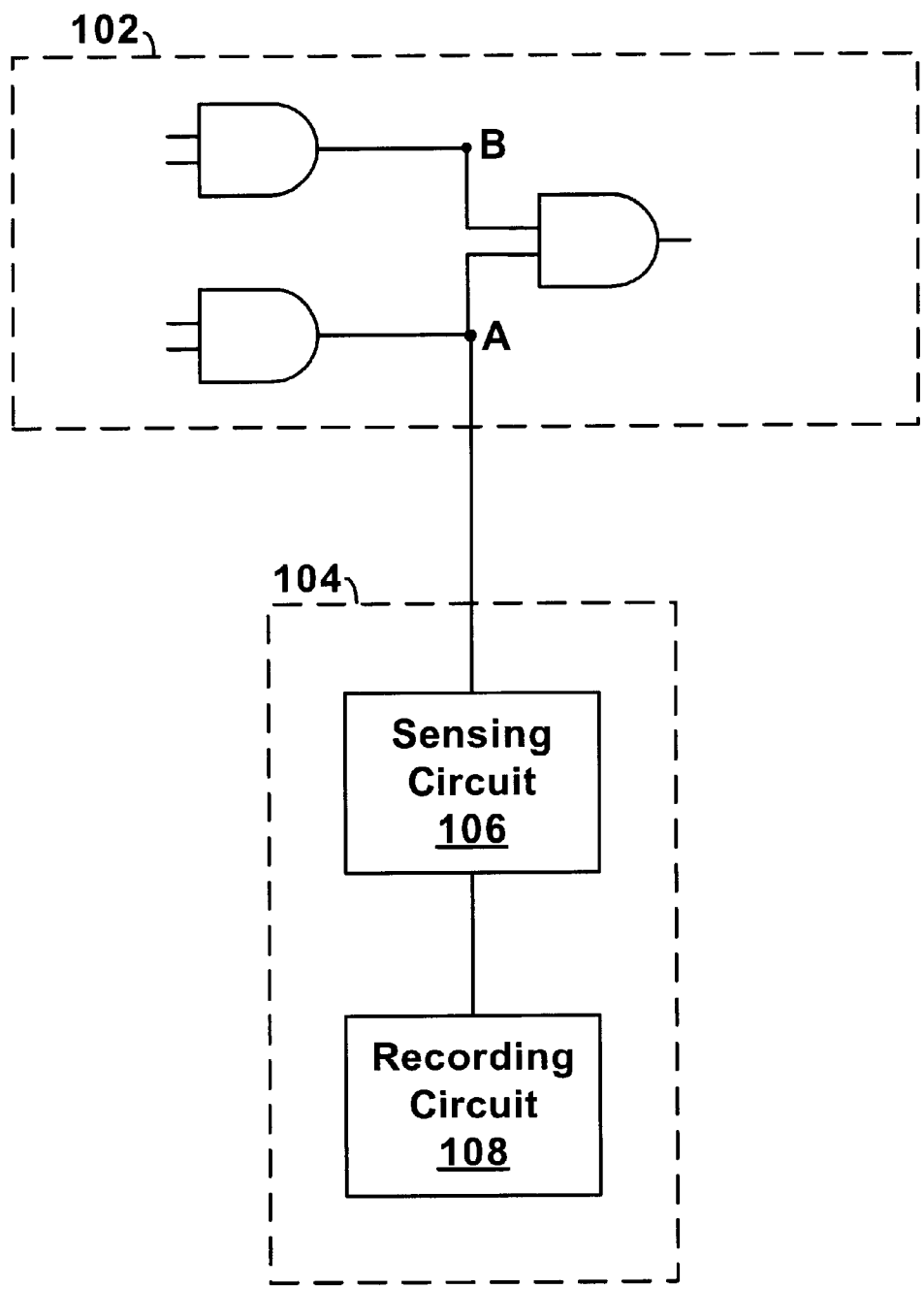
FIG. 1 is a block diagram illustrating one embodiment of a logic state transition system.

Referring now to the figures, and more particularly FIG. 1, a block diagram of a logic state transition system 100 is illustrated. It should be understood that the logic state transition system 100 illustrated in FIG. 1 and other arrangements described herein are set forth for purposes of example only, and other arrangements and elements can be used instead and some elements may be omitted altogether, depending on design, manufacturing and/or consumer preferences.

By way of example, the logic state transition system 100 includes a logic circuit 102 coupled to a logic state transition sensor circuit 104. The logic state transition sensor circuit 104 includes a sensing circuit 106 coupled to a recording circuit 108. The logic state transition system 100 may also include additional sensing or recording circuitry other than (or in addition to) that illustrated.

The logic circuit 102 is illustrated to be three AND gates coupled together. The outputs of two of the AND gates are inputs for the remaining AND gate. The logic circuit 102 as illustrated is arbitrary and is only used for illustrative purposes of operation of the logic state transition sensor circuit 104. Consequently, the logic circuit 102 may comprise any electronic circuitry and/or electronic components in any shape and/or fashion. For example, the logic circuit 102 may be a microprocessor, an integrated circuit, combinatorial or sequential logic, or any electrical circuitry that can perform any function.

In yet other embodiments, the logic circuit 102 may be a device functioning as a transducer that provides logic-type transitions representative of certain events that may have occurred in an otherwise analog circuit (or events relating to changes in an analog signal). For example, an analog signal whose voltage or current exceeds a threshold voltage or current may be detected by a comparator causing a transition in the comparator's output (where the comparator would be functioning as a transducer); a detector may function to measure alternating current (AC) voltage ripple in a power supply voltage, and responsively generate logic-type transitions, etc. As should be apparent to those of skill in the art, the functions of the logic circuit 102 are not critical to embodiments of the present invention, since other circuits may be employed to achieve advantages of the invention.

The logic state transition sensor circuit 104 is coupled to the logic circuit 102 at a node. For example, as shown in FIG. 1, the logic state transition sensor circuit 104 is coupled to node A of the logic circuit 102. The logic state transition sensor circuit 104 may be connected to the logic circuit 102 at any point of connection within the logic circuit 102 through which signals are transferred. The logic state transition sensor circuit 104 may also include additional elements as well, such as voltage measuring circuitry, for example.

The sensing circuit 106 may be connected to the node of the logic circuit 102 at which the logic state transition sensor circuit 104 is connected. The sensing circuit 106 may receive signals from the node (i.e., node A) and determine whether the signal corresponds to a logic high (i.e., a Boolean logic "1" value) or a logic low (i.e., a Boolean logic "0" value). Each signal received from node A may have a voltage that corresponds either to a logic high or a logic low. For example, signals with voltages of 2.5 volts (V) or lower may be considered a logic low and signals with voltages greater than 2.5V may be considered a logic high. However, any correspondence of voltages and logic high/low may be appropriate depending upon the logic circuit 102. For example, the logic circuit 102 may be a microprocessor that operates with signals that have voltages between 0–0.3V, thus a logic low may correspond to voltages less than 0.15V and a logic high may correspond to voltages more than 0.15V. As discussed above, the actual signal of interest may be an analog signal, and as such, the distinction between logic levels may be arbitrary. In this regard, a transducer may be integrated into the logic state transition sensor circuit 104. Other examples are possible as well.

The sensing circuit 106 may alternatively determine when a logic state transition has occurred. For example, the sensing circuit 106 may receive signals from node A and identify when Boolean logic low to high or high to low signal transitions have occurred based on a change in the signal at node A.

The recording circuit 108 is coupled to an output of the sensing circuit 108. The recording circuit 108 may record signals from the sensing circuit 106 and may also produce output voltage signals representative of an amount of signals or logic state transitions recorded. For example, an output signal with a high voltage may indicate that a large amount of logic state transitions have been recorded, and conversely an output signal with a low voltage may indicate that a low amount of logic state transitions have been recorded.

In operation, the logic state transition sensor circuit 104 may determine a number of logic state transitions that have occurred at node A (i.e., the connection node) and output a voltage signal proportional or representative of the number of logic state transitions. Additionally, the logic state transition sensor circuit 104 may monitor node A and determine how many transitions are made within a given time period as well.

The logic state transition sensor circuit 104 may also be connected to multiple nodes within the logic circuit 102, and determine a number of logic state transitions that occur at the multiple nodes. For example, the logic state transition sensor circuit 104 may be coupled to nodes A and B of the logic circuit in order to determine when a logic state transition occurs at both of the inputs of the output AND gate. Other examples are possible as well.

Figure 2A:
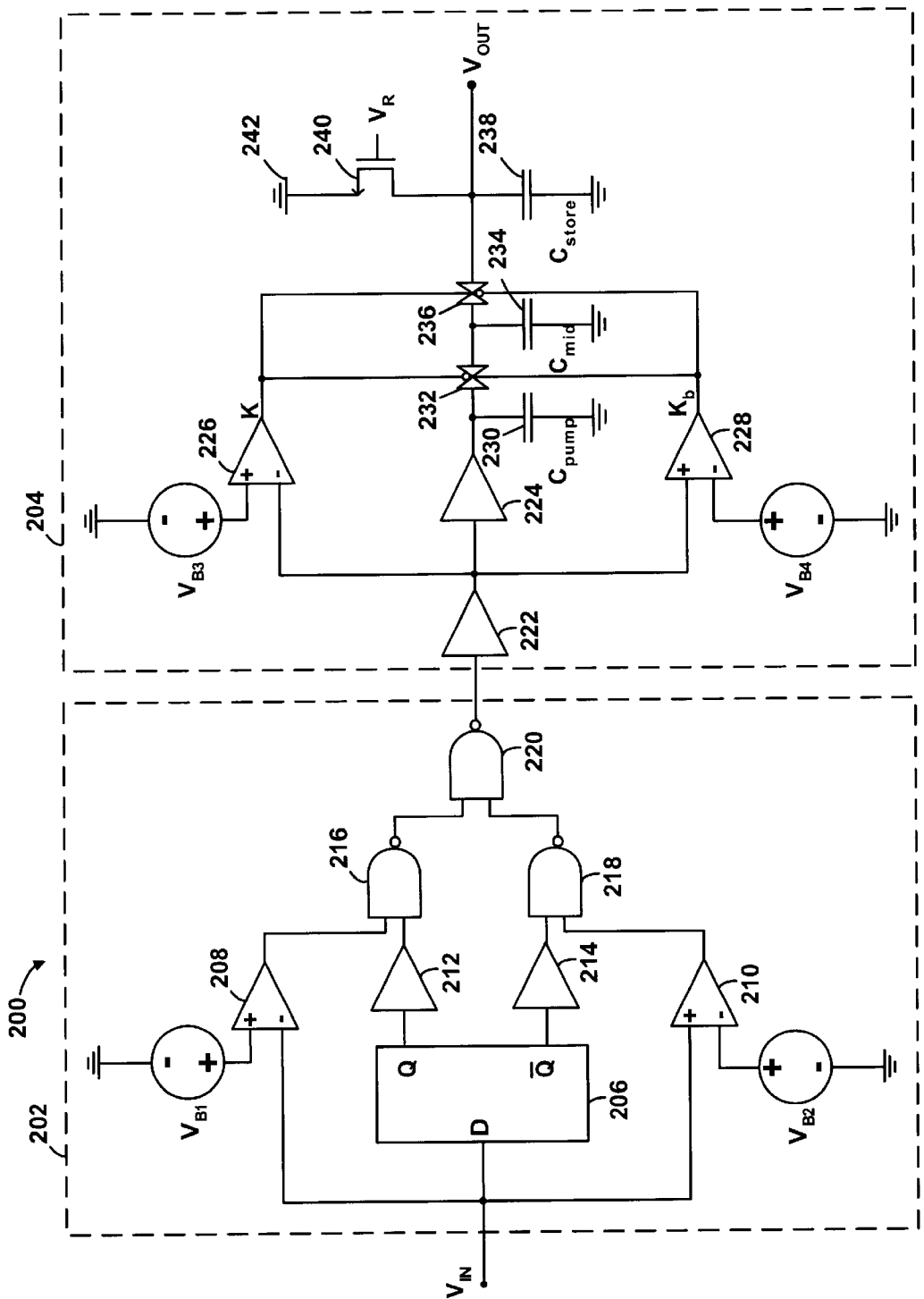
FIG. 2A is a schematic view of one embodiment of a logic state transition sensor circuit.

FIG. 2A is a schematic view of one embodiment of a logic state transition sensor circuit 200. The logic state transition sensor circuit 200 may include a sensing circuit 202 coupled to a recording circuit 204. The sensing circuit 202 and the recording circuit 204 may include many electrical components such as, for example flip-flops, logic gates, capacitors, switches, transistors, and others.

The sensing circuit 202 has an input node, node $V_{IN}$, that may be connected to a node of a logic circuit whose logic state transitions are to be sensed. The logic state transition sensor circuit 200 may measure logic transitions within integrated circuits, on printed circuit boards, within microprocessors, or any type of logic circuit. Therefore, node $V_{IN}$ may represent any node within any circuit. The sensing circuit 202 may optionally include a transducer (not shown) coupled to node $V_{IN}$ if necessary for the generation of logic state transitions from otherwise analog signals and circuits.

Node $V_{IN}$ is connected to a D flip-flop 206, a negatively biased comparator 208 (the positive input is referenced at voltage $V_{B1}$), and a positively biased comparator 210 (the negative input is referenced at voltage $V_{B2}$). However, the comparators 208 and 210 may have equivalent bias voltages as well. Due to the provision of a bias voltage $V_B$, which may be an intermediate voltage between voltages representing a logic one and a logic zero, comparator 208 functions as a logic inverter, while comparator 210 functions as a repeater, or non-delay buffer.

The positive output of the D flip-flop 206 (i.e., the Q output) is connected to a delay buffer 212 and the negative output of the D flip-flop 206 (i.e., the $\overline{Q}$ output) is connected to a delay buffer 214. The output of the negatively biased comparator 208 is an input to a NAND gate 216 and the output of the delay buffer 212 is another input to the NAND gate 216. Similarly, the output of the positively biased comparator 210 is an input to another NAND gate 218 and the output of the delay buffer 214 is another input to the NAND gate 218. The outputs of NAND gates 216, 218 are inputs to another NAND gate 220. The output of NAND gate 220 is the output of the sensing circuit 202.

The recording circuit 204 receives the output of the sensing circuit 202 at a logic shaper 222. The logic shaper's 222 output is coupled to a logic driver 224, a negatively biased comparator 226 (positive input referenced at voltage $V_{B3}$), and a positively biased comparator 228 (negative input referenced at voltage $V_{B4}$). However, the comparators 226 and 228 may have equivalent bias voltages as well. As another example, the bias voltages $V_{B1}$ and $V_{B3}$ may be equivalent, and the bias voltages $V_{B2}$ and $V_{B4}$ may be equivalent.

The output of the logic driver 224 is connected to a pump capacitor 230 ($C_{pump}$) and a switch 232. The outputs of the negatively biased comparator 226 and the positively biased comparator 228 are also coupled to the switch 232 and another switch 236. As with comparators 208 and 210, comparators 226 and 228 function as inverters and repeaters, respectively, thereby providing complementary outputs to control the switches 232, 236.

The switch 232 is coupled to a mid-capacitor 234 ($C_{mid}$) and the switch 236. The switch 236 is coupled to a store capacitor 238 ($C_{store}$), and both the switch 236 and $C_{store}$ 238 are coupled to a reset transistor 240 (biased by voltage $V_R$). The store capacitor $C_{store}$ 238 is also coupled to node $V_{OUT}$, which is the output of the recording circuit 204. A reset transistor 240, in turn, is coupled to ground 242 (i.e., a 0V source) and node $V_{OUT}$.

The voltage potential at the node $V_{OUT}$ may be delivered to an analog-to-digital converter for digitization, an operational amplifier, an analog comparator, an analog memory for storage, or any component or element for processing purposes.

As discussed herein, circuit elements such as voltage sources, comparators, delay elements, and logic gates including AND, NAND, OR, X-OR, inverters, or others are well known in the art. Furthermore, any of the logic gates presented herein may be replaced by other logic gates, an arrangement of logic gates, or other components that perform the same Boolean functions. For example, components of the logic state transition sensor circuit 200 may be substituted by other components that can perform similar functions; such as complementary metal-oxide semiconductor (CMOS) inverters replacing the negatively biased comparator 208 (or 226) and CMOS buffers replacing the positively biased comparator 210 (or 228). Note that although the bias voltages $V_{B1}$–$V_{B4}$ are shown explicitly, each can be implemented as a resistor divider, a MOSFET divider, precision current sources, etc.

In addition, the sensing circuit 202 and the recording circuit 204 may comprise more of fewer components. Furthermore, the logic state transition sensor circuit 200 may be a monolithic sensor formed from a single crystal, such as a monolithic silicon chip or produced in or on a monolithic chip. Of course, one of skill in the art will appreciate that any suitable devices may be used, including bipolar devices, MOS, CMOS, biCMOS, etc., and any suitable process technology may be used, based on semiconductor materials such as silicon, gallium arsenide, silicon-germanium, etc. Additionally, capacitance values, bias voltages, and other element specifications presented herein are for illustrative purposes only, since other values may be used instead based on a type of a circuit to be sensed and/or a type of an output desired.

In operation, an electrical node to be sensed is connected to the sensing circuit 202 input node $V_{IN}$. The D flip-flop 206 outputs Q and $\overline{Q}$ have complementary (opposite) logic convention, where the Q output tracks the input. That is, the Q output may always assume the value of the input. Thus, whenever the sensor circuit's 202 input node $V_{IN}$ undergoes a logic state transition from a logic high to a logic low (or conversely from a logic low to a logic high), the Q output undergoes a similar transition, and the $\overline{Q}$ undergoes a complementary or opposite transition. Similarly, the outputs of the comparators 208, 210 toggle each time the sensor circuit's 202 input node $V_{IN}$ undergoes a logic state transition. When $V_{IN}$ is unchanging, both logic inputs to the NAND gate 220 remain at a logic high such that the NAND gate 220 output is a logic low. This results from both inputs to each initial NAND gate 216, 218 having opposite logic values.

The delay buffers 212, 214 at the outputs of the D flip-flop 206 slow down the transfer of output signals from the D flip-flop 206 to the NAND gates 216, 218. Accordingly, when $V_{IN}$ undergoes a logic state transition, the inputs to each of the NAND gates 216, 218 momentarily assume identical logic values since comparator outputs 208 and 210 immediately change output values, yet the inputs from the outputs of the D flip-flop 206 are not instantaneously propagated to the NAND gates 216, 218. For example, assume that $V_{IN}$ is at a steady-state value, such as a logic high state. The output of negatively biased comparator 208 is therefore a logic low and the output of the positively biased comparator 210 is a logic high. Thus, the inputs to the NAND gate 216 are a logic low (from the comparator 208) and a logic high (from the buffer 212), and the inputs to the NAND gate 218 are a logic high (from the comparator 210) and a logic low (from the buffer 214). As can be seen, in the steady state, both NAND gates 216 and 218 will have complementary inputs, resulting in high outputs, consequently resulting in a low output at NAND gate 220.

When $V_{IN}$ transitions from the logic high state to a logic low state, the outputs of the comparators 208, 210 will toggle instantaneously. However, the outputs of the buffers 212, 214 will not toggle instantaneously since the buffers 212, 214 have a delay associated with the amount of time that it takes for their outputs to reflect a change to their inputs. Thus, the inputs to the NAND gate 216 will be a logic high from the comparator 208 and from the buffer 212, since the buffer's 212 output has not changed yet. Similarly, both inputs to the NAND gate 218 will be a logic low. Therefore, the logic inputs to the NAND gate 220 momentarily assume opposite logic values such that the NAND gate 220 output momentarily is a logic high. The duration of the sensing circuit's 204 momentary high output signal is determined by the amount of delay introduced by the delay buffers 212, 214. The delay may be adjusted to provide a longer or shorter pulse. A shorter pulse will allow the circuit to detect very rapid logic transitions or even glitches. A longer pulse may be implemented to detect steady-state logic state transitions.

Therefore, when $V_{IN}$ is unchanging the output of the NAND gate 220, and thus the output of the sensing circuit 202, is a steady-state logic low. However, when $V_{IN}$ transitions from a logic high state to a logic low state, the output of the sensing circuit 202 will momentarily be a logic high. The same result may occur if $V_{IN}$ transitions from a logic low state to a logic high state because the comparators 208, 210 are oppositely biased so they will simply exchange outputs. Thus, at least one of NAND gates 216 and 218 will produce a momentary low output, causing NAND gate 220 to have a momentary high output. As a result, the output of the sensing circuit 202 may momentarily be a logic high value, or a pulse signal, whenever $V_{IN}$ undergoes a logic state transition.

Of course, the output of the sensing circuit 202 at steady-state or during a logic state transition may be opposite of that discussed above by simply inserting an inverter coupled to the output of the NAND gate 220. However, whenever a logic state transition occurs at node $V_{IN}$, the sensing circuit's 202 output momentarily changes.

Figure 2B:
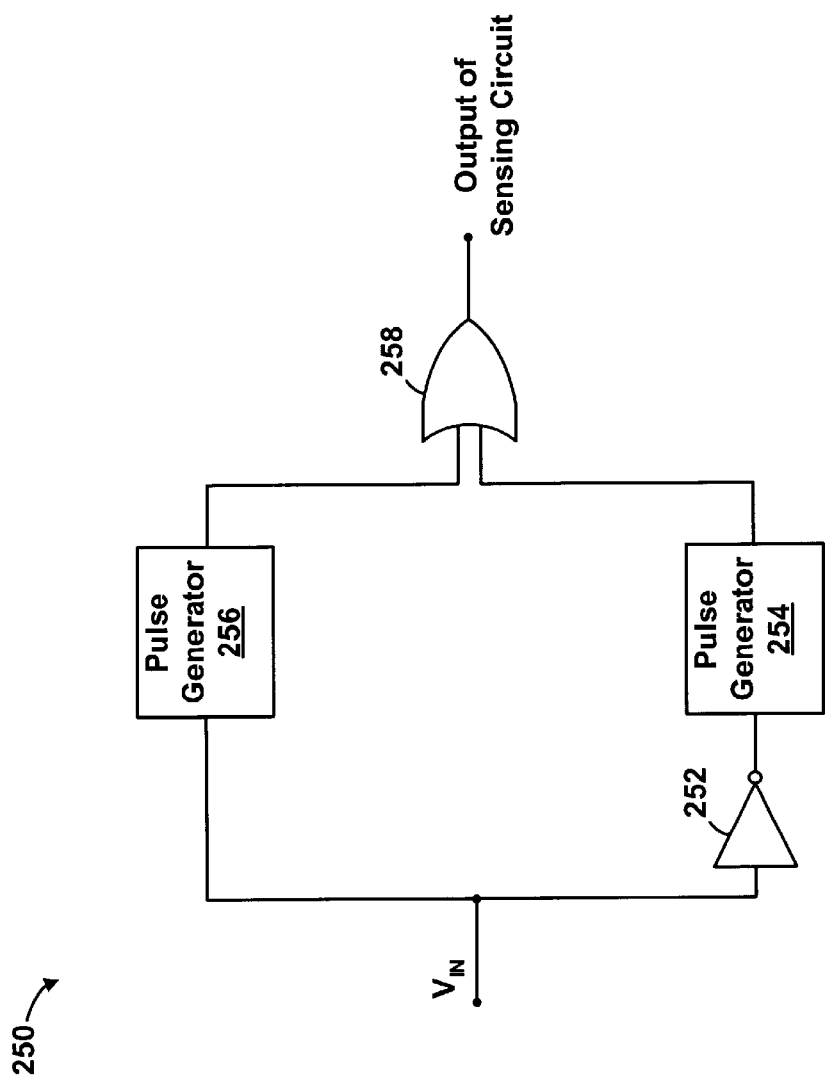
FIG. 2B is a schematic view of an alternate embodiment of a sensing circuit.

FIG. 2B is a schematic view of an alternate embodiment of a sensing circuit 250. The sensing circuit 250 comprises an inverter 252 that has an input coupled to node $V_{IN}$ and an output coupled to an input of a pulse generator 254. Node $V_{IN}$ is also coupled to an input of another pulse generator 256. Pulse generators 254 and 256 output to an OR gate 258.

Pulse generators 254 and 256 may be monostable flip-flops, such as a monostable multivibrator or a "one-shot." The pulse generators 254 and 256 produce a single output pulse (i.e., a logic high pulse) in response to a positive trigger pulse (a logic value change from a logic low to a logic high) at their inputs. The pulse generators 254 and 256 may comprise a resistor coupled to a capacitor, and the length of the single output pulse may be determined by the values of the resistor and capacitor.

In operation, the sensing circuit 250 outputs a logic low value at steady-state. However, in response to a logic value change or transition at node $V_{IN}$, the sensing circuit 250 outputs a momentary logic high value. For example, if node $V_{IN}$ changes from a logic low to a logic high value, then the output of the inverter 252 becomes a logic low, therefore the pulse generator 254 will not produce an output. However, the input to the pulse generator 256 transitioned from a logic low to a logic high value, therefore the pulse generator 256 will produce a single output pulse, resulting in the output of the OR gate 258 being a logic high value. The same result occurs if node $V_{IN}$ transitions from a logic high value to a logic low value, since in this instance, the pulse generator 254 will produce the single output pulse to generate the logic high output value of the OR gate 258. Therefore, the sensing circuit 250 may function as an edge detector, which generates a momentary output pulse. The sensing circuit 250 may also be considered a two-state finite state machine that is triggered by a rising or falling edge of a signal.

The logic state transition sensor circuit 200 may detect logic state transitions that are defined by voltage thresholds. For example, the pulse generators 254 and 256 of the sensing circuit 250 can be triggered in response to a voltage transition from below one threshold (voltages below are valid logic zeros) to above another threshold (voltages above are valid logic ones). As another example, a logic transition may be defined as a voltage transition through a voltage range, such as 5 volts. And, in response to a node's voltage changing by 5 volts, a logic state transition will have occurred. Other voltage ranges are possible as well.

Alternatively, the logic state transition sensor circuit 200 may detect logic state transitions that are defined by signal edges. For example, a signal may instantaneously transition from a value to another, generating a pulse (whether positive or negative). Once the edge of the pulse (i.e., a rise or fall in voltage) is sensed, then a logic state transition will have occurred. However one skilled in the art will recognize that logic state transitions may be defined in other manners as well.

Referring back to FIG. 2A, the output of the sensing circuit 202 is used to generate complementary clock signals to control a capacitive charge transfer process, as described below. As mentioned, when $V_{IN}$ is unchanging (whether it remains at a logic high or a logic low), the output of the sensing circuit 202 is a steady-state logic low value. Therefore the input to the recording circuit 204 will be a logic low when $V_{IN}$ is unchanging, and the output of the comparator 226 (labeled as K) is a logic high and the output of the comparator 228 (labeled as $K_b$) is a logic low. The signals K and $K_b$ are used as complementary clocking signals to control switches 232 and 236. Thus, the switch 232 is open since the top input of switch 232 from the comparator 226 is high (as indicated by the small circle at the point where converter 226 is connected to switch 232, a high input will open the switch, and a low signal will close it) resulting in both of the switch's 232 control inputs being in the "off" state. Switch 236 is therefore closed since the input from comparator 228 is low (the inverted input) resulting in both of the switch's 236 control inputs being in the "on" state. With switch 232 open, $C_{mid}$ 234, and $C_{store}$ 238 may be essentially disconnected from the recording circuit 204.

In one embodiment, the switches 232 and 236 are parallel connected CMOS FETs, (one positive channel (PMOS), one negative channel (NMOS), with the drain of each device connected to the source of the other), where the "inverting" input of the switch is the gate of the PMOS such that a logic low turns it on, and the "non-inverting" input is the NMOS gate, such that a logic high turns it on. This is typically referred to as a CMOS transmission gate. Alternative switch structures may also be used When $V_{IN}$ undergoes a logic state transition, the output of the sensing circuit 202 is a momentary logic high, thus K becomes a logic low and $K_b$ becomes a logic high. Therefore, switch 232 is momentarily closed connecting $C_{pump}$ 230 to $C_{mid}$ 234, which both become charged to a voltage value corresponding to the logic high value. $C_{pump}$ 230 may perform as a current driver by charging $C_{mid}$ 234 to the voltage potential of the logic high signal. $C_{pump}$ 230 may essentially help to ensure that $C_{mid}$ 234 becomes fully charged to the voltage potential of the logic high signal, therefore, $C_{pump}$ 230 may be an optional component of the recording circuit 204. While switch 232 is closed, switch 236 is momentarily open and $C_{store}$ remains at its current charge value. In an alternative embodiment, the logic driver 224 need not be driven by the logic shaper 222, but may simply be tied to a supply voltage. In yet a further alternative embodiment, $C_{pump}$ 230 and the logic driver 224 are replaced with a current source capable of charging $C_{mid}$ 234 whenever switch 232 is closed.

When the sensing circuit's 202 output returns to a logic low due to the propagation of the signals through the delay buffers 212, 214, signals K and $K_b$ return to logic high and low values, respectively. Therefore, the switch 232 opens after the momentary time period and $C_{pump}$ 230 (or other current source) then becomes disconnected from $C_{mid}$ 234. The switch 236 closes and $C_{mid}$ 234 becomes connected to $C_{store}$ 238. $C_{mid}$ 234 then transfers a portion of its charge to $C_{store}$ 238 and the charge on $C_{store}$ 238 incrementally increases. $C_{store}$ 238 provides an output voltage at node $V_{OUT}$.

Since switch 232 is open while switch 236 is closed, $C_{store}$ 238 is disconnected from any direct current generated by the output signals from the sensing circuit 202. $C_{store}$ 238 might then only receive a charge from $C_{mid}$ 234, rather than directly from the input signal to the recording circuit 204. In this manner, the charge on $C_{store}$ 238 can incrementally increase, rather than increase to the capacitor's full potential charge, when a logic state transition occurs. Therefore, the incremental increase may correspond to a logic state transition. If $C_{store}$ 238 was directly connected to the logic high signal, the voltage potential on $C_{store}$ 238 may increase to that of the logic signal, and therefore, no correlation may be obtained between a number of logic state transitions and the voltage or charge stored on $C_{store}$ 238.

$C_{mid}$ 234 may transfer all of its charge to $C_{store}$ 238 or only a portion of its charge. If $C_{mid}$ 234 and $C_{store}$ 238 have a ratio $C_{ratio}$ such that $C_{store} >> C_{mid}$, then the transfer of charge from $C_{mid}$ 234 to $C_{store}$ 238 may produce an incremental increase in the voltage potential of $C_{store}$. Therefore, the resulting charge on $C_{store}$ 238 is the charge that $C_{mid}$ 234 transfers plus the charge that $C_{store}$ 238 originally held. Mathematically, the incremental charge accumulated per logic state transition can be defined as shown below in equation 1 (Eq. 1).

$$C_{mid} V_{mid} + C_{store} V_{store} = (C_{mid} + C_{store}) V'_{store} \qquad \text{Eq. 1}$$

Where $C_{mid}$ and $C_{store}$ are capacitance values of the capacitors; $V_{mid}$ is the voltage on $C_{mid}$ prior to switch 232 closing; $V_{store}$ is the voltage on $C_{store}$ prior to switch 232 closing; and $V'_{store}$ is the resulting voltage on $C_{store}$ after $C_{mid}$ has transferred its charge (i.e., switch 232 has closed and re-opened).

Using Eq. 1, a ratio of capacitances can be defined as shown below in equation 2 (Eq. 2).

$$C_{ratio} = \frac{C_{store}}{C_{mid}} \qquad \text{Eq. 2}$$

If $C_{store} >> C_{mid}$, i.e., $C_{ratio}$ is large, then the charge transferred to $C_{store}$ may incrementally increase the voltage potential of $C_{store}$.

The voltage amount of the logic state transition (e.g., a logic transition of a logic low of 1V to a logic high of 6V would result in a voltage amount of 5V) is equal to the difference in voltages on $C_{store}$ 238 from before and after the logic state transition. This is shown below in equation 3 (Eq. 3).

$$V_{event} = V'_{store} - V_{store} \qquad \text{Eq. 3}$$

Where $V_{event}$ is the voltage transition amount. Using Eq. 1 and Eq. 2, $V_{event}$ is related to $C_{ratio}$ as shown below in equation 4 (Eq. 4).

$$V_{event} = \frac{V'_{store}}{1 + C_{ratio}} \qquad \text{Eq. 4}$$

Therefore, n events or n logic state transitions may yield an ideal output voltage $V_{OUTideal}$ of the recording circuit 204 as shown below in equation 5 (Eq. 5).

$$V_{OUTideal}(n) = \frac{n V'_{store}}{1 + C_{ratio}} \qquad \text{Eq. 5}$$

However, with switch 236 closed after the momentary time period, $C_{store}$ 238 then constantly receives a charge from $C_{mid}$ 234 since the switch 236 now will remain closed until another logic state transition occurs at node $V_{IN}$. Therefore, the transfer of additional charge from $C_{mid}$ 234 to $C_{store}$ 238 while switch 236 is closed may begin to saturate since $C_{store} >> C_{mid}$. The actual accumulated voltage $V_{OUTactual}$ at the output node $V_{OUT}$ may be as shown below in equation 6 (Eq. 6).

$$V_{OUTactual}(n) = \frac{V'_{store}}{1 + C_{ratio}} \sum_{i=1}^{n} \left( \frac{C_{ratio}}{1 + C_{ratio}} \right)^{i-1} \qquad \text{Eq. 6}$$

The resulting discrepancy between the ideal and the actual accumulated voltage may result in an error. In one instance, a reasonable limit of permissible error may be one-half of the ideal incremental voltage as shown below in equation 7 (Eq. 7).

$$V_{error} = V_{OUTideal} - V_{OUTactual} = \frac{1}{2} \times \frac{V'_{store}}{1 + C_{ratio}} \qquad \text{Eq. 7}$$

The logic state transition sensor circuit 200 output voltage $V_{OUT}$ is proportional to or representative of the number of logic state transitions sensed by the sensing circuit 202. The $V_{error}$ may indicate an amount of voltage that the output voltage may fluctuate while still corresponding to a number of logic state transitions.

The output voltage $V_{OUT}$ may be linearly proportional or otherwise related or representative in any desired manner to the number of logic state transitions sensed. In addition, the output voltage $V_{OUT}$ may be proportional to a number of logic pulse transitions, such as a logic high-low-high or a low-high-low pulse train, that may have been sensed. A logic pulse transition may also be considered a glitch event. Any correlation between the output voltage $V_{OUT}$ and a number of logic state transitions may be provided, for example by correlating discrete or ranges of voltages with a number of logic state transitions.

The voltage potential at the node $V_{OUT}$ may be reset to 0V, or any desired and preset voltage level, using the reset transistor 240 (biased with voltage $V_R$). In FIG. 2A, the reset transistor 240 is coupled to ground 242, therefore, the reset transistor 240 may remove the charge on $C_{store}$ 238 and return its voltage potential to 0V, thus lowering the voltage potential at node $V_{OUT}$ to 0V. However, the reset transistor 240 may be coupled to any voltage potential other than ground 242, such that the voltage potential on $C_{store}$ 238 and that at node $V_{OUT}$ may be reset to any desired voltage level.

Figure 2C:
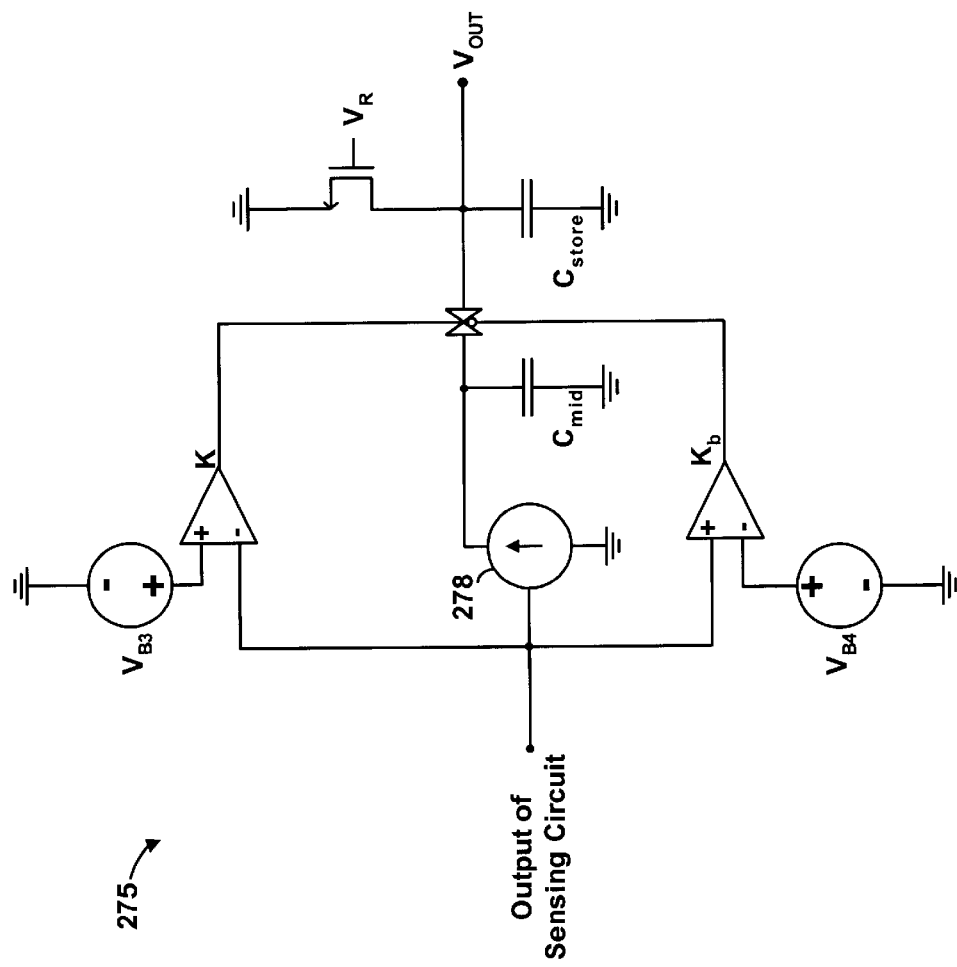
FIG. 2C is a schematic view of an alternate embodiment of a recording circuit.

FIG. 2C is a schematic view of an alternate embodiment of a recording circuit 275. The recording circuit 275 is similar to recording circuit 204. However, recording circuit 275 includes a current source 278 coupled to $C_{mid}$. The current source 278 is also coupled to the output of the sensing circuit. The output signal of the sensing circuit controls operation of the current source 278. In response to a pulse signal, or logic high value output from the sensing circuit, the current source 278 effectively "turns on" and charges $C_{mid}$. And after the momentary pulse signal from the sensing circuit propagates through the current source 278, the current source 278 effectively "turns off" or becomes disconnected from $C_{mid}$, such that when $C_{mid}$ is connected to $C_{store}$, the current source 278 is not supplying current.

The current source 278 may be any source that can be provide or supply a sufficient amount of power to $C_{mid}$. As mentioned, the current source 278 includes a mechanism to effectively control operation of the current source 278. The mechanism may be a switch coupled to the output of the sensing circuit, the output of the current source 278, and the input of $C_{mid}$, that closes in response to a logic high value, and opens in response to a logic low value, such that current source 278 becomes connected or disconnected to $C_{mid}$ based on such logic values. Other mechanisms are possible as well.

In yet other embodiments, the current source 278 may be replaced by a switch coupled to a bias voltage or a supply voltage. And in response to the momentary output signal from the sensing circuit, the switch may close in order to connect the bias voltage to $C_{mid}$ so as to charge $C_{mid}$. After the momentary pulse propagates through the switch, the switch may open and disconnect the bias voltage from $C_{mid}$.

Figure 3A:
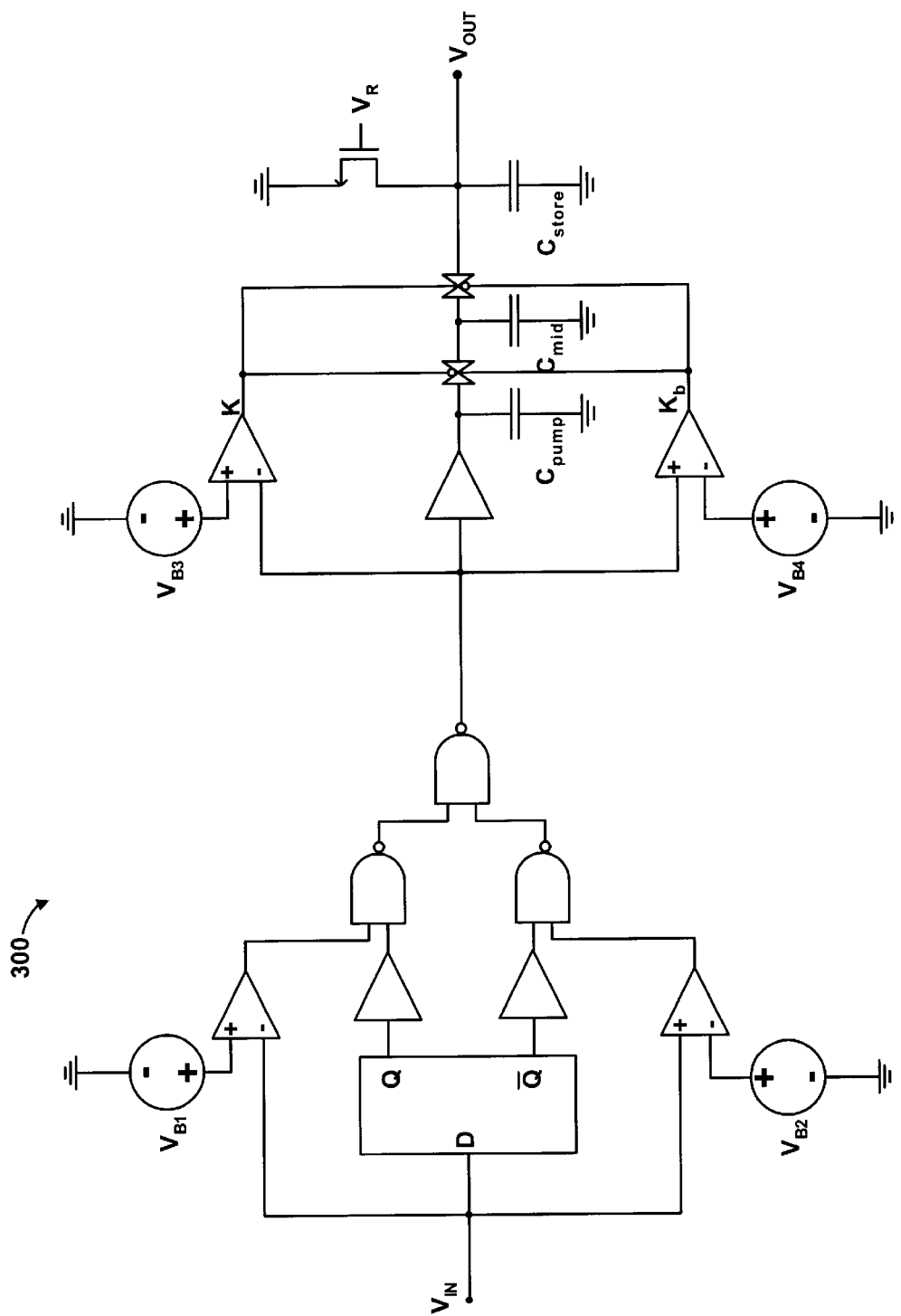
FIGS. 3A–3C are schematic views of alternate embodiments of a logic state transition sensor circuit.
Figure 3B:
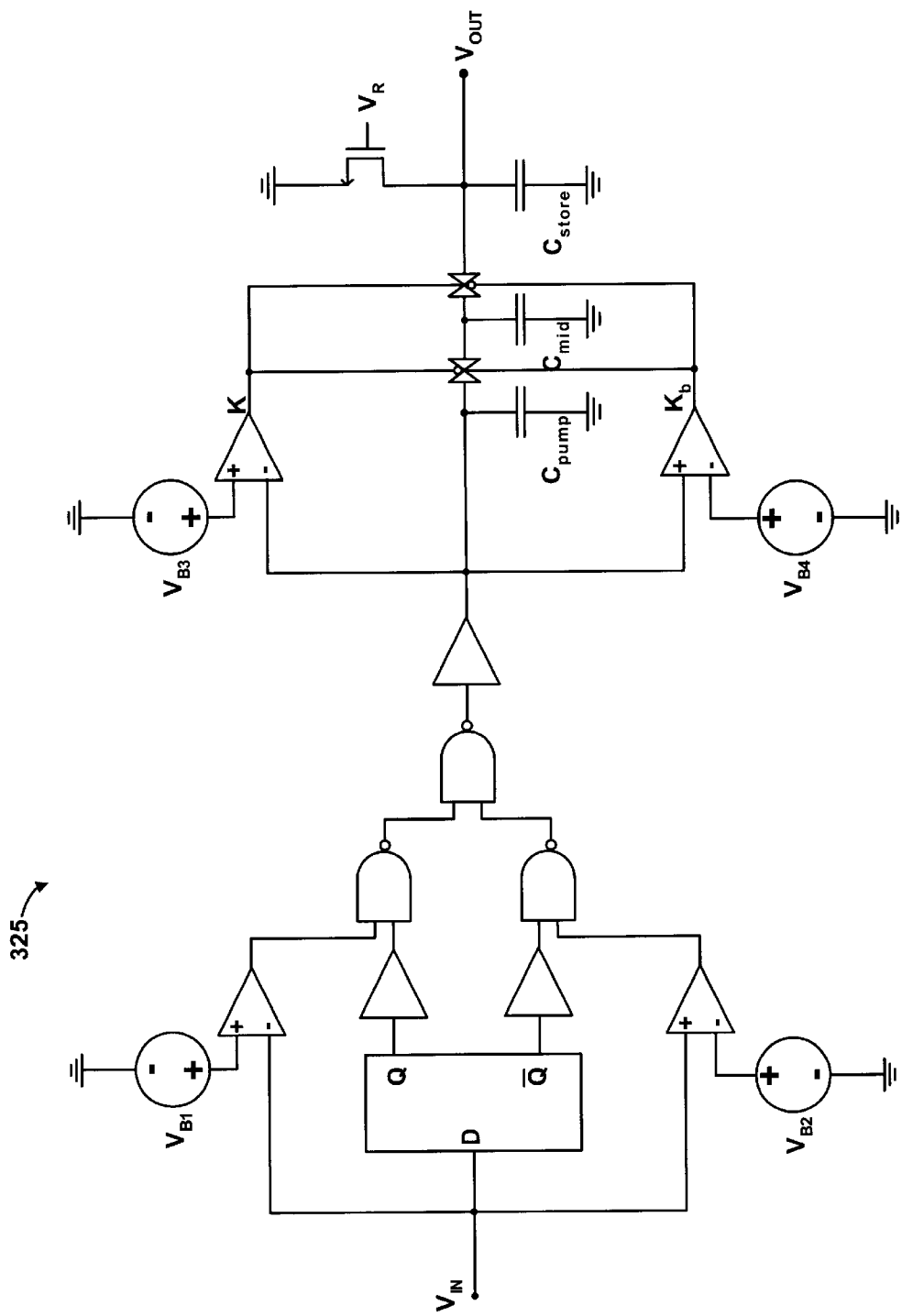
Figure 3C:
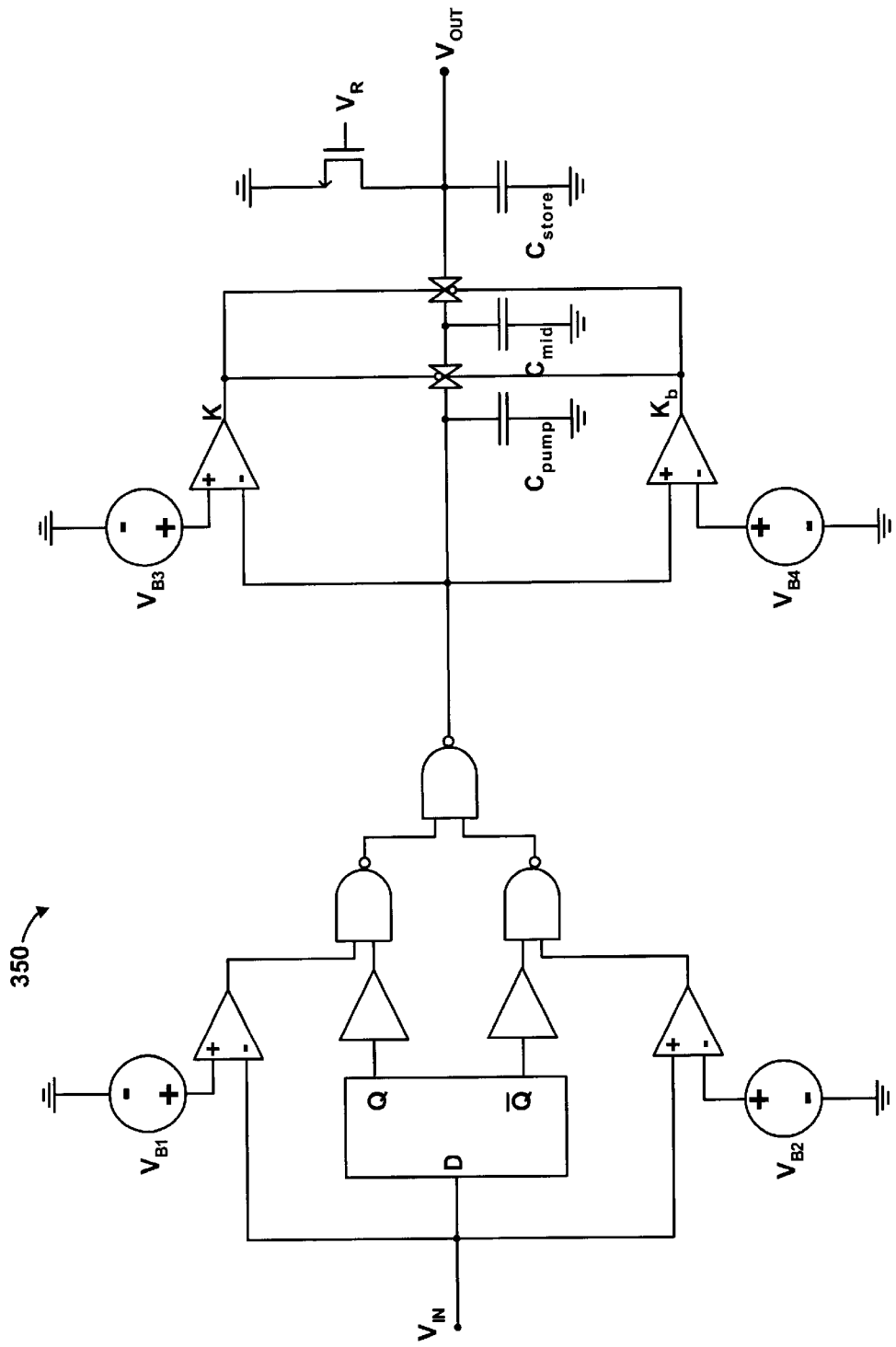

FIGS. 3A–3C are schematic views of alternate embodiments of logic state transition sensor circuits 300, 325, and 350. FIG. 3A illustrates the logic state transition sensor circuit 300 substantially the same as the logic state transition sensor circuit 200 except that no logic shaper is included. A logic shaper delivers a non-inverting output voltage characteristic with an abrupt transition between a minimum potential and a maximum potential. The logic shaper may output a voltage potential approximately equal to the mean of the minimum and maximum potentials. Therefore, a logic shaper is an optional component of the logic state transition sensor circuit 300, which may not be necessary in some applications. For example, if logic transitions comprise clear and sharp voltage signals, then a logic shaper may be omitted. Note that slowly transitioning signals from the sensing circuit 202 may cause phase errors in K and $K_b$ (due to variations of comparators 226 and 228 and/or their reference voltages) thereby affecting the accuracy of the overall circuit, and its output voltage $V_{OUT}$, therefore a logic shaper may be desirable.

FIG. 3B illustrates the logic state transition sensor circuit 325 substantially the same as the logic state transition sensor circuit 200 except that no logic driver is included. A logic driver delivers a non-inverting output voltage with high current sinking or current sourcing characteristics, therefore a logic driver is an optional component of the logic state transition sensor circuit 200, which can be omitted if desired.

FIG. 3C illustrates the logic state transition sensor circuit 350 substantially the same as the logic state transition sensor circuit 200 except that no logic shaper and no logic driver is included. Other components of the logic state transition sensor circuits 300, 325, and 350 may be omitted as well to accommodate specific circuits or logic transition measuring techniques. In addition, additional components may be added to the logic state transition sensor circuits 300, 325, and 350 in order to accommodate other circuits as well.

Figure 4A:
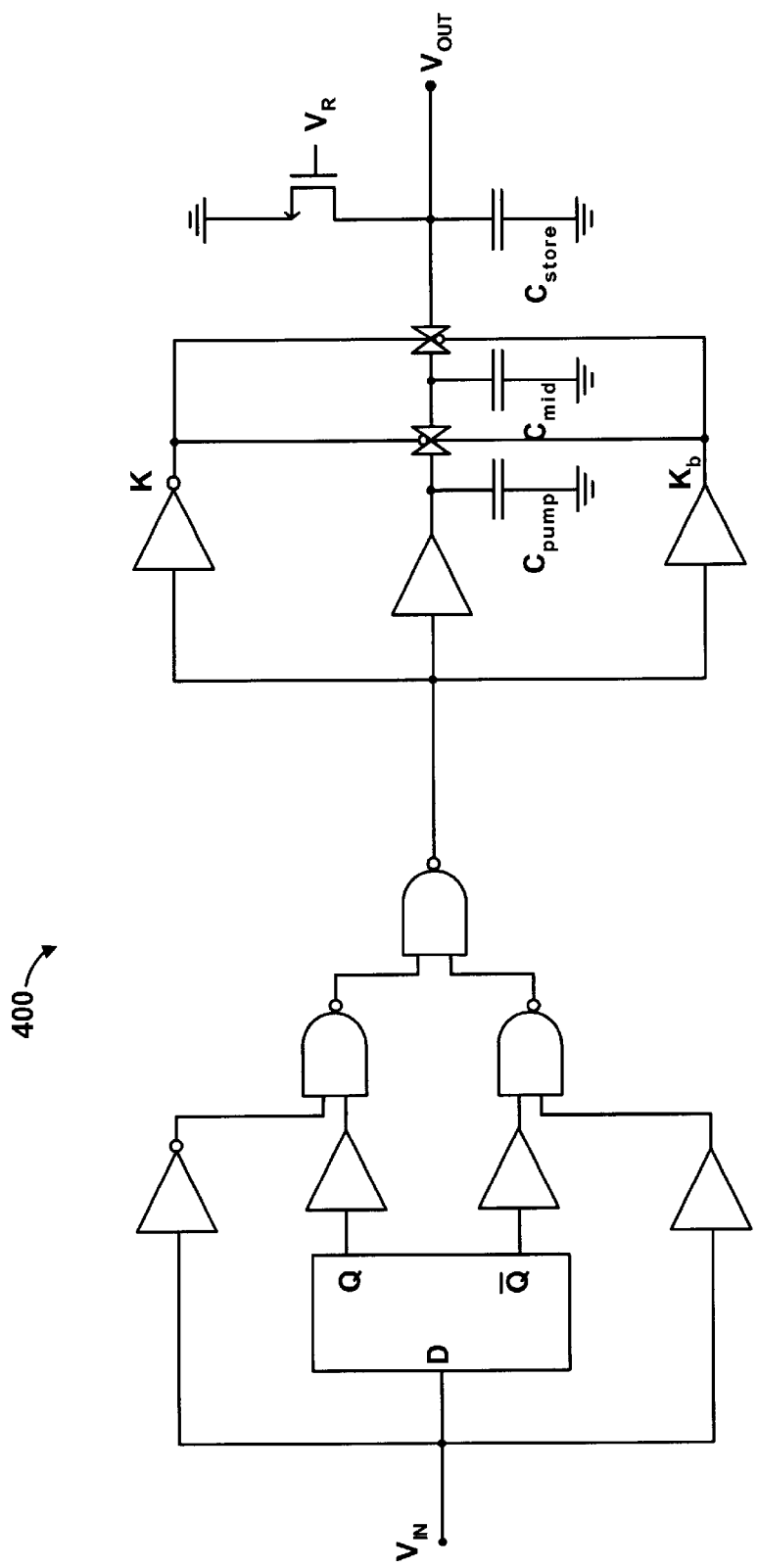
FIGS. 4A–4C are schematic views of still further alternate embodiments of a logic state transition sensor circuit.
Figure 4B:
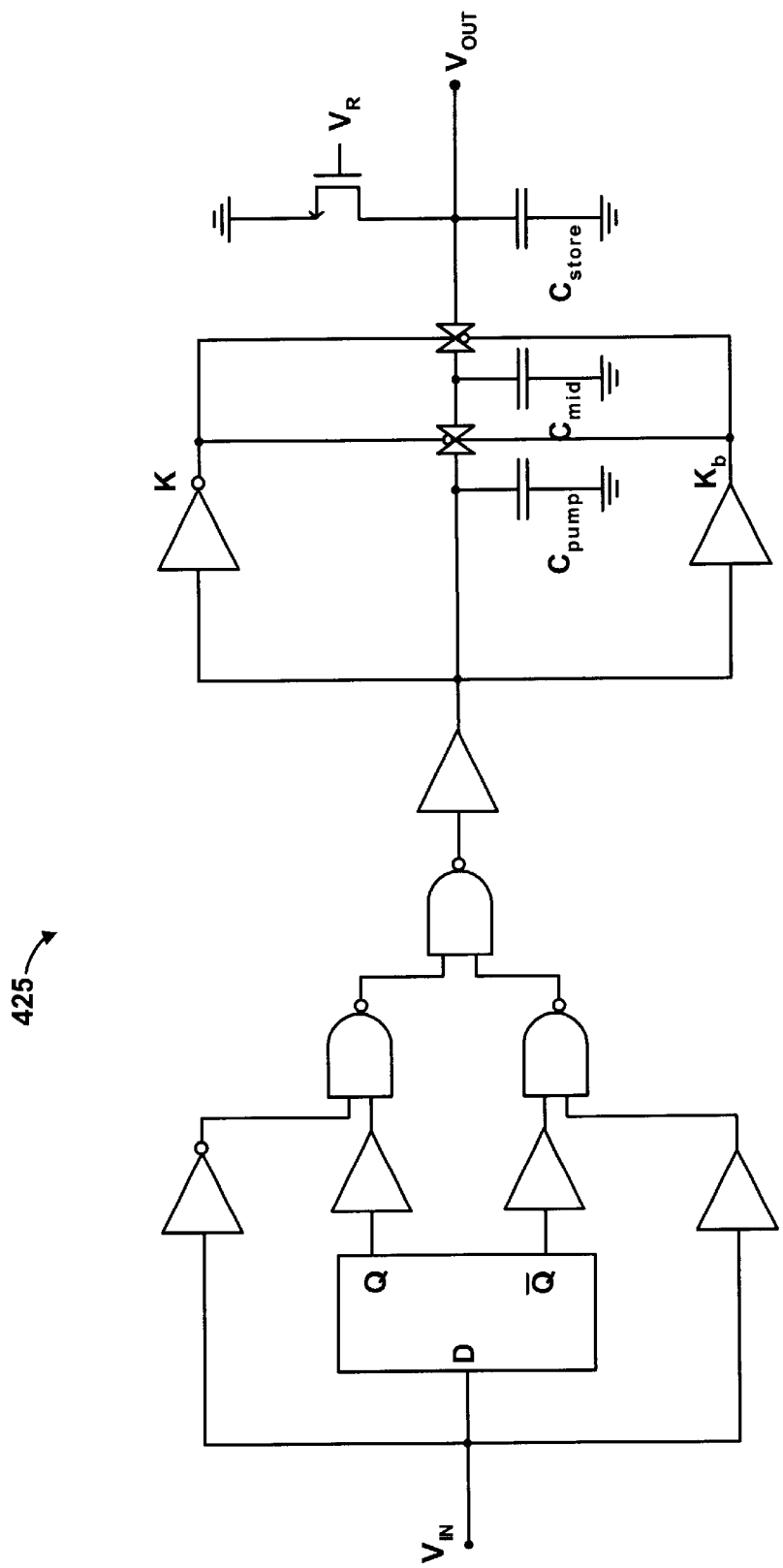
Figure 4C:
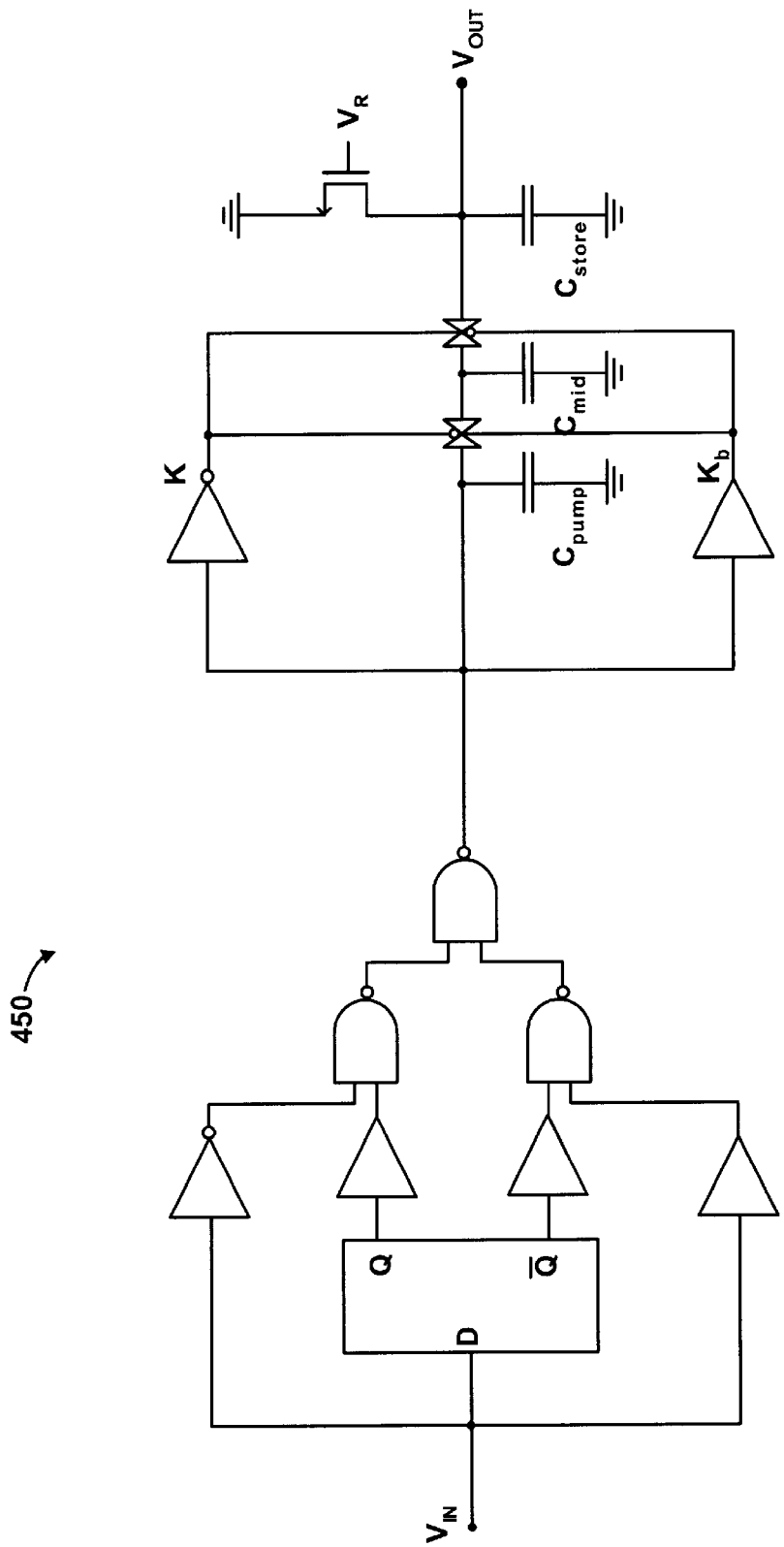

FIGS. 4A–4C are schematic views of still further alternate embodiments of logic state transition sensor circuits 400, 425, and 450. FIG. 4A illustrates the logic state transition sensor circuit 400 substantially the same as the logic state transition circuit 300 except that the negatively biased comparators have been replaced by inverters and the positively biased comparators have been replaced by buffers.

FIG. 4B illustrates the logic state transition sensor circuit 425 substantially the same as the logic state transition sensor circuit 325 except, as with the logic state transition sensor circuit 400, the comparators have been replaced by inverters and buffers.

FIG. 4C illustrates the logic state transition sensor circuit 450 substantially the same as the logic state transition circuit 350, except, again the comparators have been replaced by inverters and buffers. As illustrated by FIGS. 3A–3C and FIGS. 4A–4C, more or fewer components may be substituted by other logic elements that perform similar functions as well.

Figure 5:
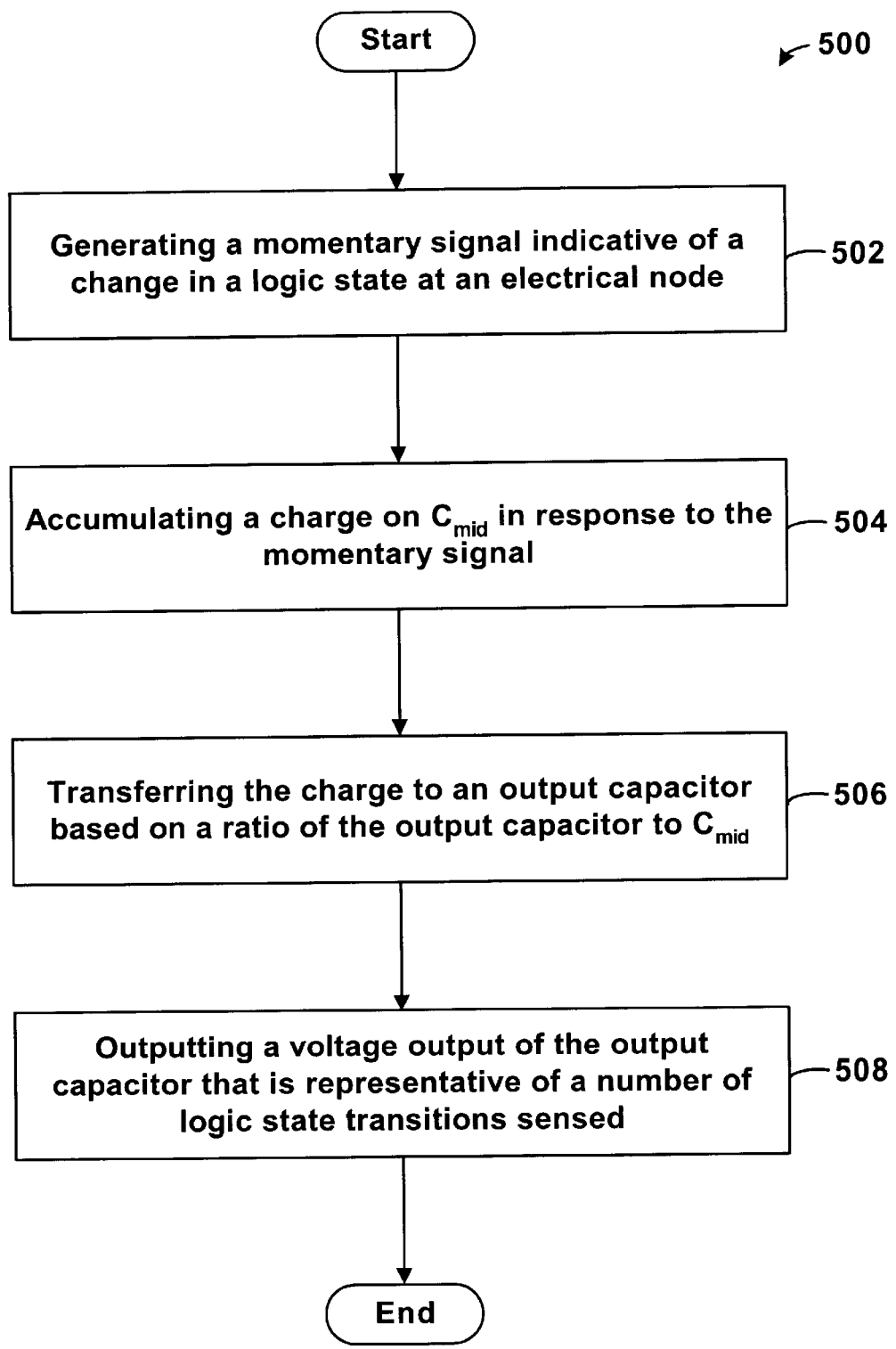
FIG. 5 is a flowchart generally illustrating a method of sensing and recording logic state transitions.

In one embodiment, the logic state transition sensor circuit 200 senses logic state transitions and records them using charge accumulation based on a ratio of capacitors. FIG. 5 is a flowchart generally illustrating a method 500 relating to this process. As shown at block 502, the logic state transition sensor circuit 200 generates a momentary signal indicative of a change in a logic state at an electrical node within a circuit. The momentary signal may be a pulse or a logic high signal. A charge may be accumulated on $C_{mid}$ 234 in response to the momentary signal, as shown at block 504. The charge may then be transferred to an output capacitor, such as $C_{store}$ 238 based on a ratio of the capacitance values of $C_{mid}$ 234 and $C_{store}$ 238, as shown at block 506. $C_{store}$ 238 may then output a voltage corresponding to its stored charge, which is representative of a number of logic state transitions sensed, as shown at block 508.

The logic state transition sensor circuit 200 may refine or calibrate simulation or statistical methods by providing accurate measured data of actual logic state transitions for combinations of operations and logic inputs that occur during operation of a circuit. Therefore, a logic circuit may be simulated using multiple techniques in order to provide results that generally coincide. In addition, the direct measurement and recording of logic state transitions can be used in power estimation and minimization of logic circuits. Knowing the capacitor ratio value $C_{ratio}$ and measuring the voltage potential at the node $V_{OUT}$ at a time t may yield a substantially exact number of logic state transitions, which have occurred within the time interval t.

In order for a transition to be recorded by the recording circuit 204, it may be desirable for the duration of the logic state transition (e.g., either a high-low or low-high), the glitch event, the logic pulse transition, or whatever causes the transition, to be approximately one gate delay in length. For example, if a logic pulse transition causes a logic state transition, then the pulse should approximately occur for a time period comprising one gate delay. This duration is therefore technology and process dependent. For example, within a microprocessor, one gate delay may be a time delay on the order of nanoseconds (ns), while within a logic circuit, one gate delay may be a time delay on the order of microseconds ($\mu$s). The logic state transition sensor circuit 200 may be able to sense and record logic state transitions with a transition duration as short as 1 picosecond (ps).

Figure 6:
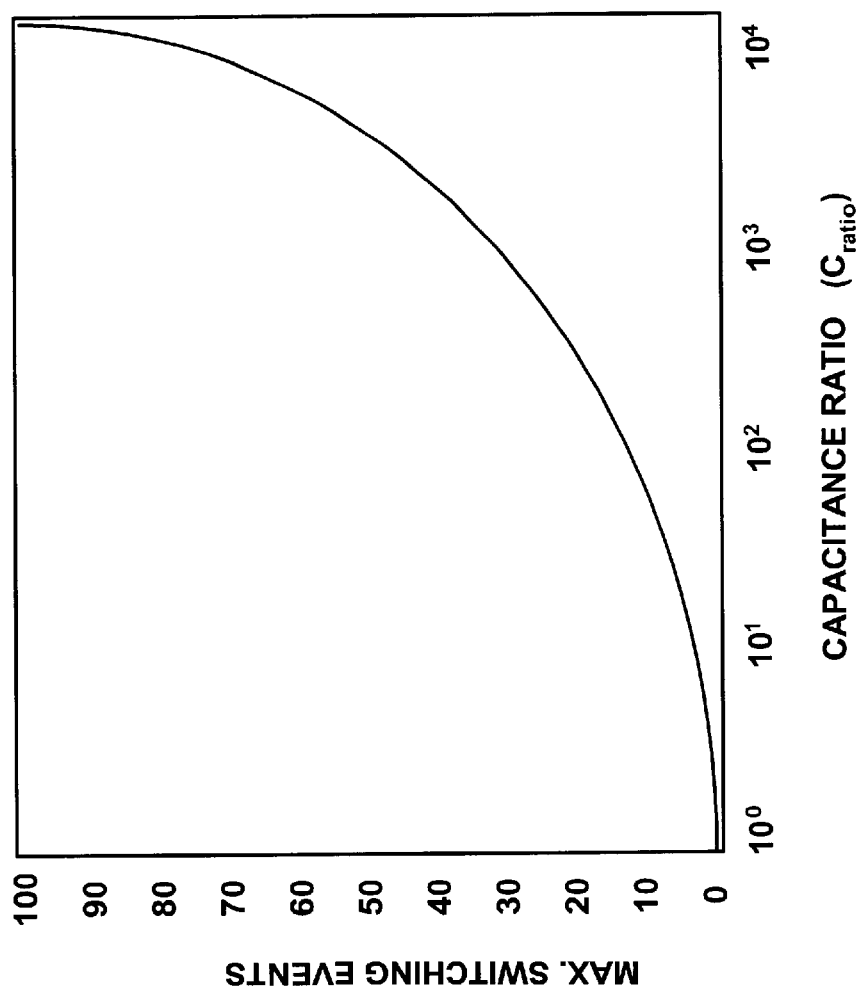
FIG. 6 is a graphical representation of a theoretical specification of a number of logic state transitions that can be recorded by the logic state transition sensor circuit.

The logic state transition sensor circuit 200 may be able to measure an amount of logic state transitions preferably ranging in number from about 1 to 10,000. The range of logic state transitions may depend on the capacitor ratio $C_{ratio}$. FIG. 6 is a graphical representation of a theoretical specification of a number of logic state transitions that can be recorded by the logic state transition sensor circuit 200. As shown in the graph, if the capacitance ratio (i.e., $C_{ratio}$) is small because the capacitance values of $C_{store}$ and $C_{mid}$ are similar in magnitude, then the logic state transition sensor circuit 200 might not be able to record a large number of transitions. However, if $C_{ratio}$ is large as a result of the capacitance value of $C_{store}$ being much larger than $C_{mid}$, then the logic state transition sensor circuit 200 can record a large number of transitions since $C_{store}$ may be able to hold a significant amount of charge. As an example, if $C_{ratio}$ is approximately 100, then the maximum number of switching events (or logic state transitions) that can be recorded is approximately 10. But if $C_{ratio}$ is approximately 10,000, then the maximum number of switching events that can be recorded is approximately 100.

Those skilled in the art to which the present invention pertains may make modifications resulting in other embodiments employing principles of the present invention without departing from its spirit or characteristics, particularly upon considering the foregoing teachings. Accordingly, the described embodiments are to be considered in all respects only as illustrative, and not restrictive, and the scope of the present invention is, therefore, indicated by the appended claims rather than by the foregoing description. Consequently, modifications of structure, sequences and the like apparent to those skilled in the art would still fall within the scope of the invention.

For example, although the foregoing description focuses mainly on measuring logic state transitions, the logic state transition sensor circuit presented herein may measure any type of voltage signal, whether the voltage signal represents logic values or not. Other examples are possible as well.

We claim:

1. A logic state transition sensor circuit comprising:
   a sensing circuit coupled to an electrical node, the sensing circuit being operable to generate a pulse in response to a logic state transition at the electrical node; and
   a recording circuit coupled to the sensing circuit, the recording circuit being operable to accumulate a capacitive charge in response to each pulse generated by the sensing circuit,
   wherein the accumulated capacitive charge is representative of a number of logic state transitions sensed at the electrical node.

2. The logic state transition sensor circuit of claim 1, wherein in response to each pulse generated by the sensing circuit, the recording circuit accumulates an incremental capacitive charge.

3. The logic state transition sensor circuit of claim 2, wherein the incremental capacitive charge is accumulated using charge accumulation based on a ratio of capacitors.

4. The logic state transition sensor circuit of claim 1, wherein the logic state transition is selected from the group consisting of a change in voltage, a rising edge of a signal, and a falling edge of a signal.

5. The logic state transition sensor circuit of claim 1, wherein the sensing circuit comprises a pulse generator being operable to generate the pulse in response to the logic state transition at the electrical node.

6. The logic state transition sensor circuit of claim 1, wherein the sensing circuit comprises:
   an input terminal coupled to the electrical node;
   a delay flip-flop coupled to the input terminal, wherein the delay flip-flop produces a first and a second output, wherein the first output is a first logical value of a signal received at the input terminal and the second output is a second logical value that is the logical complement of the first logical value;
   a first delay buffer coupled to the first output of the delay flip-flop and a second delay buffer coupled to the second output of the delay flip-flop;
   a voltage inverting circuit coupled to the input terminal and a voltage non-inverting circuit coupled to the input terminal;
   a first NAND gate having input terminals connected to an output of the voltage inverting circuit and to an output of the first delay buffer; and
   a second NAND gate having input terminals connected to an output of the voltage non-inverting circuit and an output of the second delay buffer,
   wherein the first NAND gate and the second NAND gate each have outputs that are connected to inputs of a third NAND gate, wherein the third NAND gate produces a logic low value when a signal received at the input terminal reaches a steady-state value.

7. The logic state transition sensor circuit of claim 6, wherein the voltage inverting circuit and the voltage non-inverting circuit are implemented with components selected from the group consisting of CMOS inverters, operational amplifiers, and analog voltage comparators.

8. The logic state transition sensor circuit of claim 1, wherein the recording circuit comprises an output terminal being operable to produce an output voltage potential representative of the number of logic state transitions sensed.

9. The logic state transition sensor circuit of claim 1, wherein the recording circuit accumulates the charge within a first capacitor and transfers the charge from the first capacitor to a second capacitor according to a ratio of the first capacitor and the second capacitor.

10. The logic state transition sensor circuit of claim 1, wherein the recording circuit comprises a logic shaping circuit coupling the sensing circuit and the recording circuit, wherein the logic shaping circuit outputs a non-inverting voltage output with an abrupt transition between a minimum voltage potential and a maximum voltage potential.

11. The logic state transition sensor circuit of claim 1, wherein the recording circuit comprises a current source being operable to charge a first capacitor in response to each pulse generated by the sensing circuit.

12. The logic state transition sensor circuit of claim 1, wherein the recording circuit comprises:
   a first capacitor connected to an output of the sensing circuit;
   a second capacitor connected to the first capacitor through a first switch;
   a third capacitor connected to the second capacitor through a second switch;
   a voltage inverting circuit having an input connected to the output of the sensing circuit and an output connected to a negative-logic input of the first switch and to a positive-logic input of the second switch; and
   a voltage non-inverting circuit having an input connected to the output of the sensing circuit and an output connected to a positive-logic input of the first switch and to a negative-logic input of the second switch,
   wherein when the sensing circuit outputs the pulse, the first capacitor charges the second capacitor, and after a momentary time period the second capacitor transfers its charge to the third capacitor.

13. The logic state transition sensor circuit of claim 12, further comprising a logic driver circuit inserted between the output of the sensing circuit and the first capacitor.

14. The logic state transition sensor circuit of claim 12, wherein the voltage inverting circuit and the voltage non-inverting circuit are implemented using components selected from the group consisting of CMOS inverters, operational amplifiers, and analog voltage comparators.

15. The logic state transition sensor circuit of claim 1, further comprising a reset mechanism coupled to the recording circuit, wherein the reset mechanism dissipates the accumulated capacitive charge at the recording circuit.

16. A logic state transition sensor comprising:
   a sensing circuit coupled to an electrical node, the sensing circuit being operable to generate a momentary output signal in response to a logic state transition at the electrical node; and
   a recording circuit coupled to the sensing circuit, the recording circuit being operable to keep count of each momentary output signal generated by the sensing circuit, wherein the recording circuit outputs an output signal representative of a number of logic state transitions sensed at the electrical node.

17. The logic state transition sensor of claim 16, wherein the recording circuit keeps count of each momentary output signal generated by the sensing circuit by accumulating a charge on a first capacitor in response to each momentary output signal and transferring the charge from the first capacitor to a second capacitor based on a ratio of capacitance values of the first and second capacitors.

18. The logic state transition sensor of claim 17, wherein the capacitance value of the second capacitor is larger than the capacitance value of the first capacitor.

19. The logic state transition sensor of claim 18, wherein the second capacitor accumulates an incremental charge based on the transfer of charge from the first capacitor.

20. A method of sensing logic state transitions comprising:

generating a momentary signal in response to a logic state transition at an electrical node;

accumulating a capacitive charge in response to each momentary signal generated; and outputting an output signal representative of a number of logic state transitions sensed at the electrical node.

21. The method of claim 20, wherein generating the momentary signal in response to the logic state transition at an electrical node comprises producing a pulse signal.

22. The method of claim 20, wherein accumulating the capacitive charge comprises recording the logic state transition based at least on a ratio of capacitors.

23. The method of claim 22, wherein recording the logic state transition based at least on a ratio of capacitors comprises:

accumulating a charge on a first capacitor; and transferring the charge to a second capacitor after a momentary time representative of a propagation time of the momentary signal so as to incrementally increase the second capacitor's charge.

24. The method of claim 23, wherein outputting the output signal representative of the number of logic state transitions sensed at the electrical node comprises outputting the second capacitor's charge.

25. The method of claim 20, further comprising generating a steady-state signal after generating the momentary signal in response to the logic state transition at the electrical node.

* * * * *